United States Patent
Anselm et al.

(10) Patent No.: US 6,240,114 B1
(45) Date of Patent: May 29, 2001

(54) MULTI-QUANTUM WELL LASERS WITH SELECTIVELY DOPED BARRIERS

(75) Inventors: Klaus Alexander Anselm, New Providence; James Nelson Baillargeon, Springfield; Alfred Yi Cho, Summit, all of NJ (US)

(73) Assignee: Agere Systems Optoelectronics Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/130,567

(22) Filed: Aug. 7, 1998

(51) Int. Cl.[7] ................................................ H01S 5/323
(52) U.S. Cl. ............................................................ 372/45
(58) Field of Search .................................. 372/45, 46, 43

(56) References Cited

U.S. PATENT DOCUMENTS

| | | | |
|---|---|---|---|
| 4,961,197 | * 10/1990 | Tanaka et al. | 372/45 |
| 5,319,657 | * 6/1994 | Otsuka et al. | 372/43 |
| 5,949,807 | * 9/1999 | Fujimoto et al. | 372/45 |

FOREIGN PATENT DOCUMENTS 96-20522 * 7/1996 (WO) .

OTHER PUBLICATIONS

C. H. Henry et al., The Effect of Intervalence . . . , IEEE J. Quantum Electr., vol. QE–19, No. 6, pp. 947–952 (Jun. 1983).
P. J. A. Thijs et al., Progress in Long–Wavelength . . . , IEEE J. Quantum Electr., vol. 30, No. 2, pp. 477–499 (Feb. 1994).
F. Kano et al., Linewidth Enhancement . . . , IEEE J. Quantum Electr., vol. 30, No. 2, pp. 533–537 (Feb. 1994).
S. Seki et al., Design Criteria . . . , IEEE Photonics Tech. Lett., vol. 7, No. 8, pp. 839–841 (Aug. 1995).
G. D. Belenky et al., Temperature Performance . . . , IEEE Photonics Tech. Lett., vol. 9, No. 12, pp. 1558–1560 (Dec. 1995).

* cited by examiner

Primary Examiner—James W. Davie
(74) Attorney, Agent, or Firm—Michael J. Urbano

(57) ABSTRACT

An MQW laser comprises an active region in which a multiplicity of barriers each includes a doped barrier layer separated from its adjacent quantum well layers by undoped barrier layers. In a preferred embodiment, each barrier of an InGaAsP/InP SCH MQW laser includes a p-type (e.g., Be, Mg or C) delta-doped InGaAsP barrier layer sandwiched between a pair of undoped InGaAsP barrier layers. With suitable doping concentration and thickness of the delta-doped barrier layer, we have demonstrated MQW lasers with $T_o$ as high as 82 K.

2 Claims, 4 Drawing Sheets

MULTI-QUANTUM WELL LASERS WITH SELECTIVELY DOPED BARRIERS

FIELD OF THE INVENTION

This invention relates generally to semiconductor lasers and, more particularly, to multi-quantum well (MQW) lasers.

BACKGROUND OF THE INVENTION

Semiconductor laser diodes find application in many different lightwave communication systems. A reduction in the temperature sensitivity of the laser characteristics is an important consideration for such systems. Fiber-to-the-home and fiber-in-the-loop optical networks for example, require the lasers to be low cost and to be uncooled; i.e., to operate without thermoelectric (TE) cooling. Uncooled lasers have several advantages: reduced size and cost of the packaging, and elimination of the reliability issues associated with the TE cooler itself.

Of particular interest is the uncooled MQW laser which typically includes an active region formed by a multiplicity of relatively smaller bandgap quantum well layers interleaved with larger bandgap barrier layers. Under forward bias electrons and holes are injected into the quantum wells where they undergo radiative recombination at a center wavelength characteristic of the effective bandgap energy, which is determined by the quantum well material, the well thickness and other factors. The barriers serve, in part, to confine the injected carriers to the wells. Frequently, MQW lasers are incorporated into a separate confinement heterostructure (SCH) which serves, in part, to provide optical confinement of the lasing mode. In an SCH laser the active region is bounded by a pair of inner cladding layers (sometimes referred to as waveguide layers), and the latter are bounded by a pair of outer cladding layers.

The threshold current density of all laser diodes increases exponentially with increasing temperature. The empirical relationship between threshold current density and temperature is given by equation (1):

$$J = J_0 \exp\{T/T_o\} \quad (1)$$

where $J_0$ and $T_o$ are mathematical constructs, and $T_o$ is often referred to as the characteristic temperature of the laser. Because of the exponential relationship, a small change in $T_o$ produces a much larger shift in the threshold current density. In general, however, increasing $T_o$ is desirable. Several parameters are known to affect $T_o$: waveguide material composition, strain energy, and dopant concentration. See, respectively, S. Seki, et al, *IEEE Photon. Technol. Lett.*, Vol. 7, No. 8, pp. 839–841 (1995), P. J. A. Thijs, et al, *IEEE J. Quantum Electron.*, Vol. 30, No. 2, pp. 477–499 (1994), and G. L. Belenky, et al, *IEEE Photon. Technol. Lett.*, Vol. 9, No. 12, pp. 1558–1560 (1997), all of which are incorporated herein by reference.

Recently Belenky et al., supra, reported that the addition of Zn to the entire MQW active region of a strained, InGaAsP/InP MQW laser produced a small improvement in the temperature dependence of the laser threshold. Although Zn shows strong p-type conductivity in InGaAsP, it has a much lower solubility in InP than it does in InGaAsP. This fact is important because MQW lasers operating at center wavelengths of 1.3 µm and 1.55 µm lasers utilize InP as outer cladding layer material, and InGaAsP as inner cladding (waveguide), barrier and quantum well material. Zn placed in the InP outer cladding layers tends to be wicked-up by the active region of the device. Furthermore, because the quantum well layers are required to have a higher Ga and As content than that of the waveguide or barrier layers (so that the bandgap of the quantum well layers is less than that of the waveguide or barrier layers), Zn will preferentially segregate within them. (In general, Zn solubility increases with increasing Ga and As content.) Consequently, anomalous interstitial diffusion is often observed in the MQW active region and in the p-type cladding layer of Zn-doped MQW lasers. The presence of Zn (or any p-type dopant) in the quantum wells can lead to a substantial increase in the threshold current density and reduction in differential quantum efficiency (through enhanced internal losses). Precise control over the hole distribution is necessary in order to avoid such undesirable device characteristics (e.g., internal losses, threshold current density, quantum efficiency and reduced lifetime). The p-dopant distribution is among the most important for control of these parameters since the absorption losses are primarily dependent upon the hole concentration. (See, for example, C. H. Henry et al., *IEEE J. Quantum Electr.*, Vol. 19, No. 6, pp. 947–952 (1983), which is also incorporated herein by reference).

SUMMARY OF THE INVENTION

In accordance with one aspect of our invention, an MQW laser comprises an active region in which a multiplicity of barriers each includes at least one doped barrier layer separated from its adjacent quantum well layers by undoped barrier layers. In a preferred embodiment, each barrier of an InGaAsP/InP SCH MQW laser includes a p-type (e.g., Be, Mg or C) delta-doped InGaAsP barrier layer sandwiched between a pair of undoped InGaAsP barrier layers. With suitable doping concentration and thickness of a Be delta-doped barrier layer, we have demonstrated MQW lasers with $T_o$ as high as 82 K.

BRIEF DESCRIPTION OF THE DRAWING

Our invention, together with its various features and advantages, can be readily understood from the following more detailed description taken in conjunction with the accompanying drawing, in which.

Figure 1:
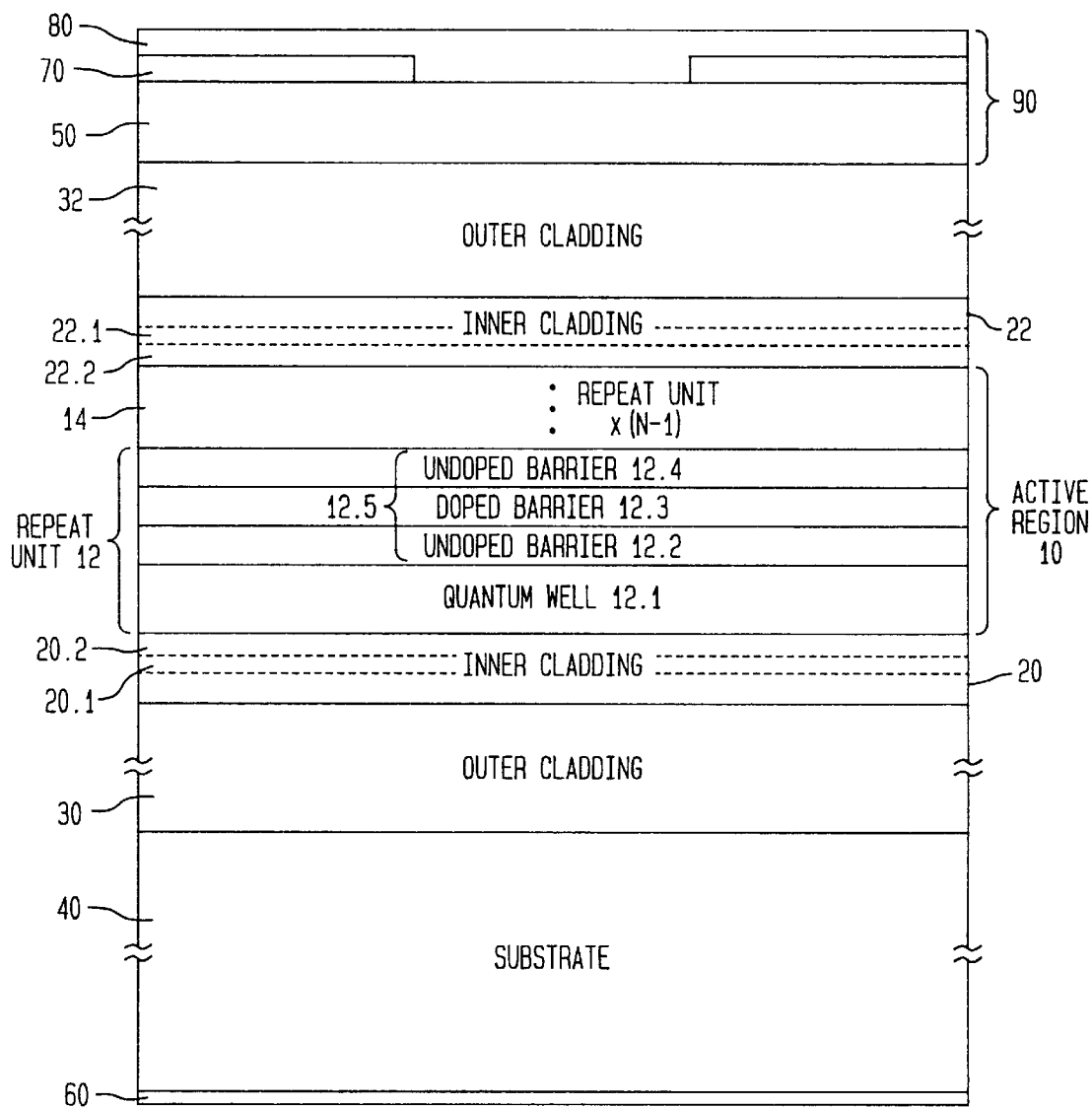
FIG. 1 is a schematic view of the layered structure of a SCH MQW laser in accordance with one embodiment of our invention.

In the interest of clarity and simplicity, FIGS. 1 and 2 have not been drawn to scale. In addition, when describing physical or optical dimensions, the symbol A stands for Angstroms, whereas when describing electric current, it stands for Amperes.

DETAILED DESCRIPTION OF THE INVENTION

With reference now to FIG. 1, a SCH MQW laser comprises a semiconductor active region 10 sandwiched between a pair of inner cladding semiconductor regions 20,22, which in turn are bounded by a pair of outer cladding semiconductor regions 30,32. The outer cladding region 30 is disposed on a support member, illustratively depicted as a semiconductor substrate 40. However, the support member could embrace other structures, such as a substrate with an epitaxial buffer layer grown thereon.

The active region includes a multiplicity of N repeat units 12 stacked between the inner cladding regions 20,22. As is well known in the art, each repeat unit comprises a quantum well (QW) region 12.1 adjacent a barrier region 12.5. Likewise it is known that each quantum well region 12.1 has a smaller bandgap than its adjacent barrier regions, so that injected carriers are confined in the quantum wells of region 12.1.

In order to make electrical contact to the laser and to supply pumping energy to the active region, a metal contact 60 is formed on the bottom of substrate 40 and a contact structure 90 is formed on the outer cladding region 32. Structure 90 includes a relatively high conductivity, contact-facilitating, semiconductor layer 50, an electrically insulating layer 70 (e.g., an oxide or nitride) and a metal contact layer 80. As is well known in the stripe geometry laser art, an elongated aperture is formed in the insulating layer 70 exposing the underlying portion of the outer cladding region 32, and the metal contact layer 80 is deposited over layer 70 so as to fill the aperture and make electrical contact to the top of the laser. When a forward bias voltage is applied across contacts 60 and 80 and current is supplied in excess of the lasing threshold, the active region generates stimulated emission of radiation at a center wavelength determined by the effective bandgap energy of the multi-quantum wells, which in turn is a function the quantum well material, the thickness of the quantum well layers, and other factors.

The particular semiconductor materials used to fabricate the device depend, in part, on the desired wavelength of operation. Group III–V compound semiconductors are typical. Thus, for example, for operation at about 0.8–0.9 $\mu$m GaAs/AlGaAs layers would be used, whereas for operation at 1.3 $\mu$m or 1.55 $\mu$m InP/InGaAsP layers would be suitable.

Of course, the stripe geometry configuration described above is merely illustrative of various gain-guided structures that could be used to implement the principles of our invention. Moreover, preferred configurations are likely found in the realm of the many index-guided structures (e.g., buried heterostructures) well known in the art. Among these the covered-mesa buried heterostructure (CMBH) is of particular interest.

In addition, the laser is provided with an optical cavity resonator within which the active region is disposed; i.e., optical feedback means to sustain the stimulated emission. Illustratively, this feedback may be provided by means of a pair of parallel cleaved crystal facets, distributed feedback (DFB) gratings, distributed Bragg reflectors (DBRs), or a combination of them.

Figure 2A:
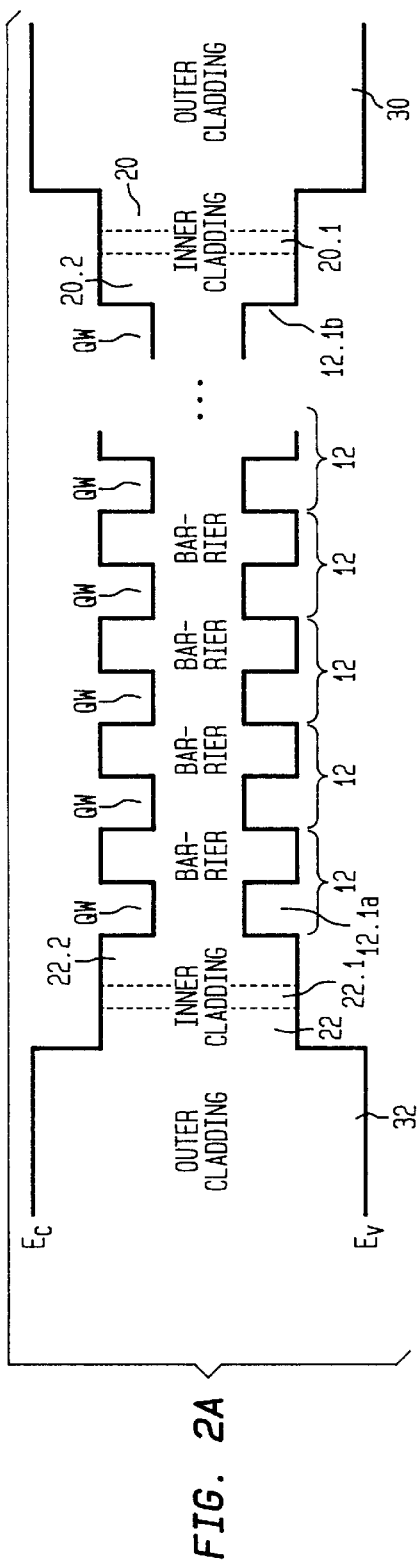
FIG. 2 shows the bandgap (FIG. 2A), p-type dopant profile (FIG. 2B) and n-type dopant profile (FIG. 2C) of the layers of the laser of FIG. 1.
Figure 2B:
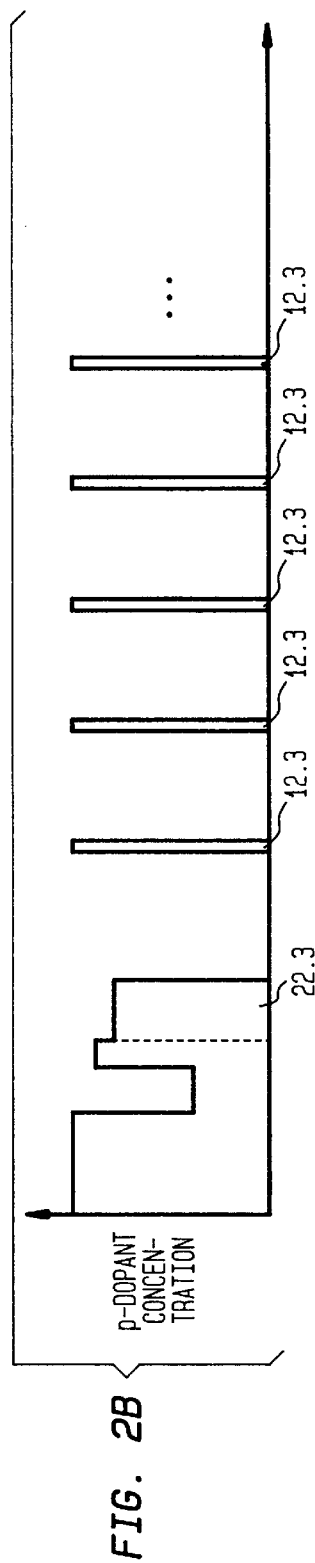
Figure 2C:
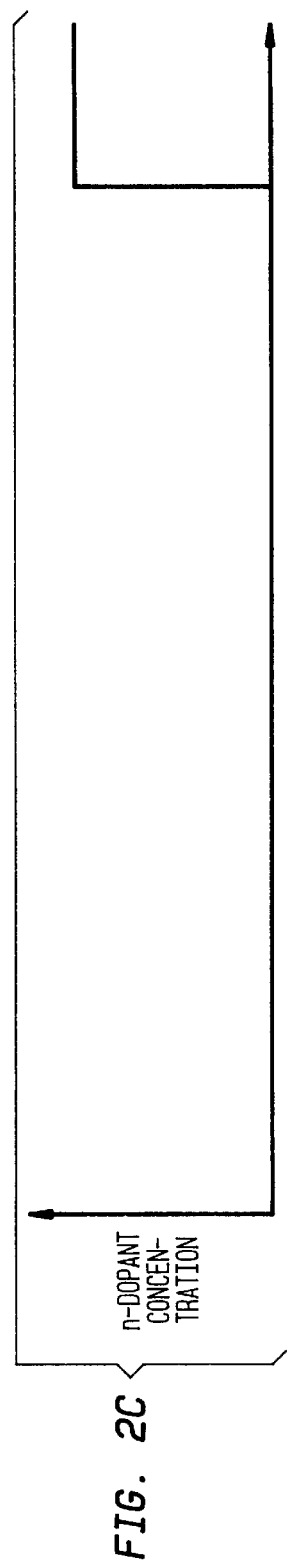

In accordance with one aspect of our invention, the active region of an MQW laser is modified so that each barrier region 12.5 includes a multiplicity of barrier layers. In each of a multiplicity of the barrier regions, one barrier layer 12.3 is doped, whereas two other spacer, barrier layers 12.2 and 12.4 are undoped and separate the doped barrier layer 12.3 from the adjacent quantum well regions 12.1. Preferably, the doped barrier layers 12.3 are thin, delta-doped layers, as shown in FIG. 2B. The spacer barrier layers, on the other hand, serve, in part, to essentially prevent dopant atoms from diffusing into the quantum wells. FIG. 2A shows schematically the bandgaps of the various layers of the laser of FIG. 1, whereas FIGS. 2B and 2C show the corresponding p-type and n-type dopant distributions, respectively.

As used herein, the term undoped means that a particular semiconductor layer or region is not intentionally doped; i.e., any doping of such a region or layer is relatively low and typically results from residual or background doping in the chamber used to grow the layers of the device.

The thickness of the barrier layers, the species used in the doped barrier, and the peak concentration of the dopant species are chosen so as to obtain the desired increase in $T_o$ without also significantly increasing losses. Various tradeoffs occur. Thus, the diffusivity (or equivalently, the difflusion length) of the dopant species in the barrier material should be relatively low so as to reduce the likelihood that dopant atoms diffuse into the quantum wells. For example, in InGaAsP/InP MQW lasers in accordance with our invention Zn is generally not a suitable dopant species, whereas Be, Mg and C are. For the same reason, the thickness of the spacer barrier layers is preferably not less than a diffuision length of the dopant species, and the thickness of each doped barrier layer may be any fraction of the total thickness of its barrier region (e.g., layer 12.3 is illustratively less than half the thickness of region 12.5), as long as the diffusion length criterion is satisfied. In practice we have found that making the barrier layer 12.3 one-fifth the total thickness of the barrier region is suitable for the dopant concentrations used.

In addition, the carrier concentration of the doped barrier layer should not be so high that the desired reduction in temperature sensitivity is achieved at the expense of undesired decreases in differential quantum efficiency and/or increases in threshold current density. Here, we have found that Be peak concentrations of about $1 \times 10^{18}$ cm$^{-3}$ are suitable In general, however, increasing the thickness of the doped barrier layers implies decreasing the peak dopant concentration and conversely, so that the total charge within each doped barrier layer remains essentially constant (at a value that gives the desired increase in $T_o$).

The diffusion length of the dopant atoms in the doped barrier layers is a well known function of several factors; e.g., growth conditions (such as growth temperature, growth rate, and Group V element (e.g., As, P) overpressure) and peak dopant concentration in the doped barrier layers. For example, for MBE growth of Be-doped InGaAsP barrier layers at temperatures of about 490–500° C. and at growth rates of about 1–2 $\mu$m/hr., the diffusion length of Be atoms is less than or equal to about 40 Å at a peak Be concentration of about 1–5$\times 10^{18}$ cm$^{-3}$.

EXAMPLES

In the following examples, various materials, dopants, concentrations, dimensions, operating conditions, process steps and other parameters are provided by way of illustration only and, unless expressly stated otherwise, are not intended to limit the scope of our invention.

For purposes of comparison, we used MBE to fabricate four different types of InGaAsP/InP SCH MQW lasers designed to operate at a center wavelength of about 1.3 $\mu$m: sample (a)—a conventional structure with an undoped active region; sample (b)—a conventional structure with undoped active region like sample (a) but with Be doping in a portion 22.3 (FIG. 2B) of the inner cladding region 22; sample (c)—a structure in accordance with one embodiment of our invention in which the delta-doped barrier layer 12.3 comprised a 20 Å thick InGaAsP layer doped with Be to a peak concentration of about $1.2\times10^{18}$ cm$^{-3}$; and sample (d)—a structure in accordance with another embodiment of our invention in which the delta-doped barrier layer 12.3 comprised a 20 A thick InGaAsP layer doped with Be to a peak concentration of about $5.0\times10^{18}$ cm$^{-3}$. The structure of samples (c) and (d) is shown in the following table, the only difference between them being the Be peak concentration in the barrier layers 12.3. The structure of samples (a) and (b) was similar to samples (c) and (d) except that the active regions were undoped, and sample (b) differed from sample (a) in that the former had the portion 22.3 of the InGaAsP inner cladding region 22 doped with Be to about $1.2\times10^{18}$cm$^{-3}$. This portion extended about 300 A (the approximate depletion width) from the InP outer cladding region 32. Our measurements showed that samples (a) and (b) had essentially identical temperature sensitivity characteristics, demonstrating that p-doping the inner cladding alone did not significantly affect $T_o$ in these conventional MQW lasers. In all cases Si was the n-type dopant.

It will be apparent from the Table that the outer cladding region 32 was a composite of four InP layers, and the inner cladding region 22 was a composite of two InGaAsP layers. In contrast, the outer and inner cladding regions 30 and 20, respectively, were single InP and InGaAsP layers, respectively. While our invention is not limited to this particular configuration of the cladding layers, it is currently a preferred design.

| LAYER | COMPOSITION | THICK (A) | STRAIN (%) | CONCENTRATION (cm$^{-3}$) |
|---|---|---|---|---|
| contact layer 50 | In$_{1-x}$Ga$_x$As (x = 0.4) | 500 | 0 | p = $1.1 \times 10^{19}$ |
| outer cladding 30 | InP | 10000 | 0 | p = $4.5 \times 10^{18}$ |
| outer cladding 30 | InP | 3500 | 0 | p = $1.0 \times 10^{18}$ |
| outer cladding 30 | InP | 2500 | 0 | p = $5.0 \times 10^{17}$ |
| outer cladding 30 | InP | 300 | 0 | p = $1.35 \times 10^{18}$ |
| inner cladding 22 | InGaAsP ($\lambda$ = 1.12 $\mu$m) | 300 | 0 | p = $1.2 \times 10^8$ |
| inner cladding 22 | InGaAsP ($\lambda$ = 1.12 $\mu$m) | 150 | 0 | undoped |
| repeat unit 14 x(N-1) | — | — | — | — |
| spacer barrier 12.4 | InGaAsP ($\lambda$ = 1.12 $\mu$m) | 40 | 0 | undoped |
| doped barrier 12.3 | InGaAsP ($\lambda$ = 1.12 $\mu$m) | 20 | 0 | p = $1.2 \times 10^{18}$ |
| spacer barrier 12.2 | InGaAsP ($\lambda$ = 1.12 $\mu$m) | 40 | 0 | undoped |
| quantum well 12.1 | InGaAsP ($\lambda$ = 1.31 $\mu$m) | 70 | 1.12 | undoped |
| inner cladding 20 | InGaAsP ($\lambda$ = 1.12 $\mu$m) | 550 | 0 | undoped |
| outer cladding 30 | InP | 6000 | 0 | n = $1.0 \times 10^{18}$ |
| substrate 40 | InP | — | 0 | n = $1.2 \times 10^{18}$ |

As shown schematically in FIG. 2B and in detail in the Table, samples (c) and (d) included a thin, Be-doped barrier layer 12.3 located, illustratively, in the center of each barrier region 12.5. The doped barrier layer was separated from the adjacent QWs by thin undoped spacer barrier layers 12.2 and 12.4. As long as the spacer barriers are present to essentially eliminate Be diffusion into the quantum wells, the doped barrier layer may be asymmetrically positioned within the barrier region.

Figure 3:
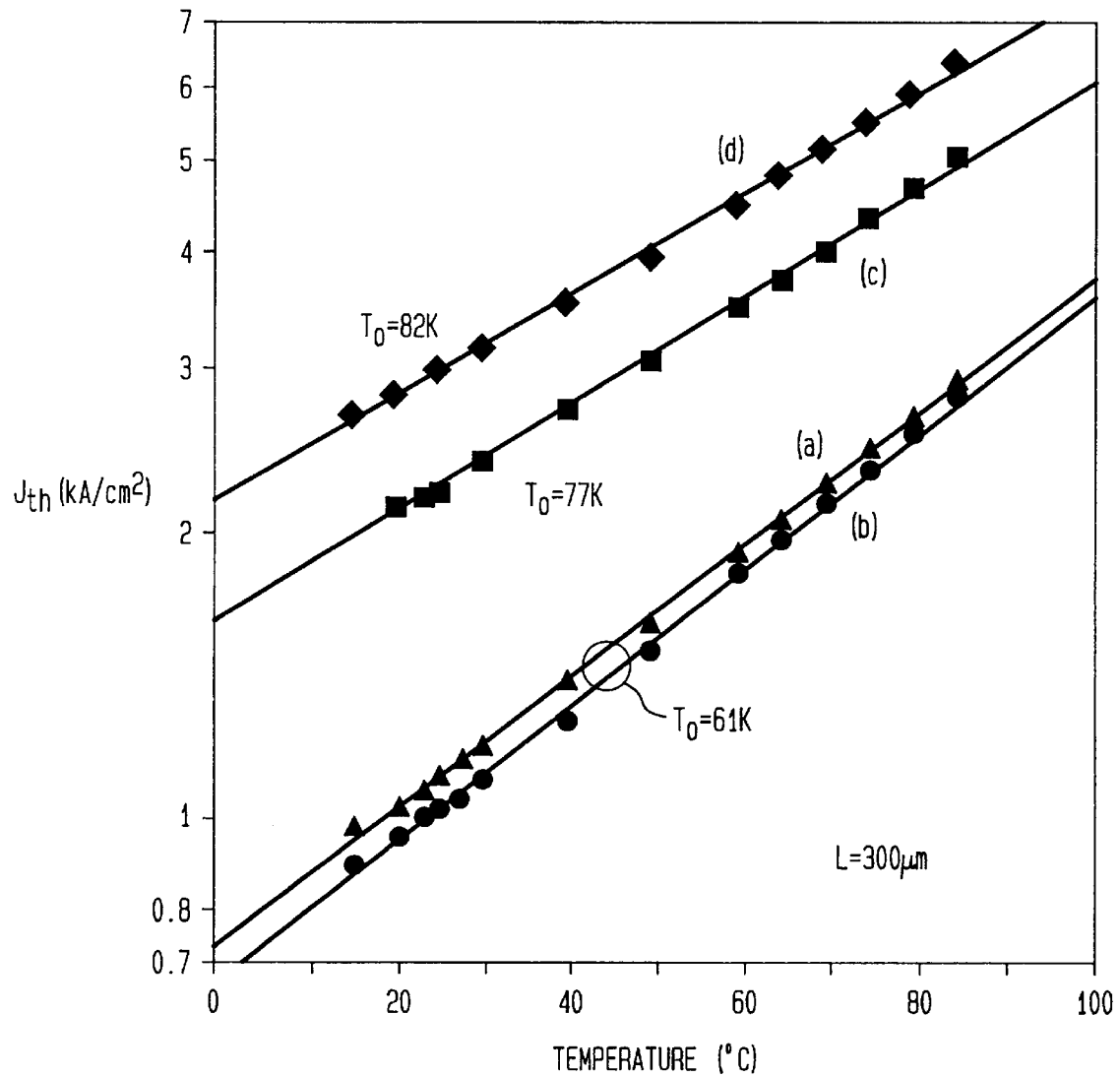
FIG. 3 is a graph comparing the temperature dependence of the broad area threshold current density $J_{th}$ of conventional SCH MQW lasers (Curves a and b) with SCH MQW lasers in accordance with one embodiment of our invention (Curves c and d)

FIG. 3 shows the threshold current density as a function of temperature of four laser samples. Corresponding hole sheet densities in the QWs of the $\delta$-doped structures were: sample (c) $2.4\times10^{11}$ cm$^{-2}$, and sample (d) $1\times10^{12}$ cm$^{-2}$. In contrast, conventional MQW lasers with undoped active regions, as in sample (a), typically have a hole sheet density on the order of $1\times10^{10}$ cm$^{-2}$. Those with undoped active regions and p-doped layer 22.3 in inner cladding region 22, as in sample (b), have densities that range from $2-5\times10^{11}$ cm$^{-2}$, under zero bias conditions. The characteristic temperatures for these devices were: sample (a)—61 K; sample (b)—61 K; sample (c)—77 K; and sample (d)—82 K, respectively. The data show that the threshold current density variation with temperature can be improved through control of the dopant concentration in the barrier layers alone. Quantitatively, our invention has demonstrated 16–21 K improvement in $T_o$.

Controlling the temperature dependence of the threshold current density is important inasmuch as a significant fraction of the input (drive) power to a laser is wasted (i.e., it does not increase the optical output power $P_{out}$) just to achieve the necessary power threshold given by:

$$P_{th}=I_{th}^2 R_f \tag{2}$$

where $I_{th}$ is the threshold current and $R_f$ is the laser diode forward resistance. Additional input power is wasted due to the internal losses $\alpha_i$, mirror losses, and a non-unity internal quantum efficiency, $\eta_i$. Another important consideration is that the slope efficiency not be significantly, adversely affected by the design changes made to improve $T_o$. Slope efficiency, which is directly proportional to the differential quantum efficiency, is defined as $P_{out}/(P_{in}-P_{th})$, the denominator representing the input power in excess of the lasing threshold.

Figure 4:
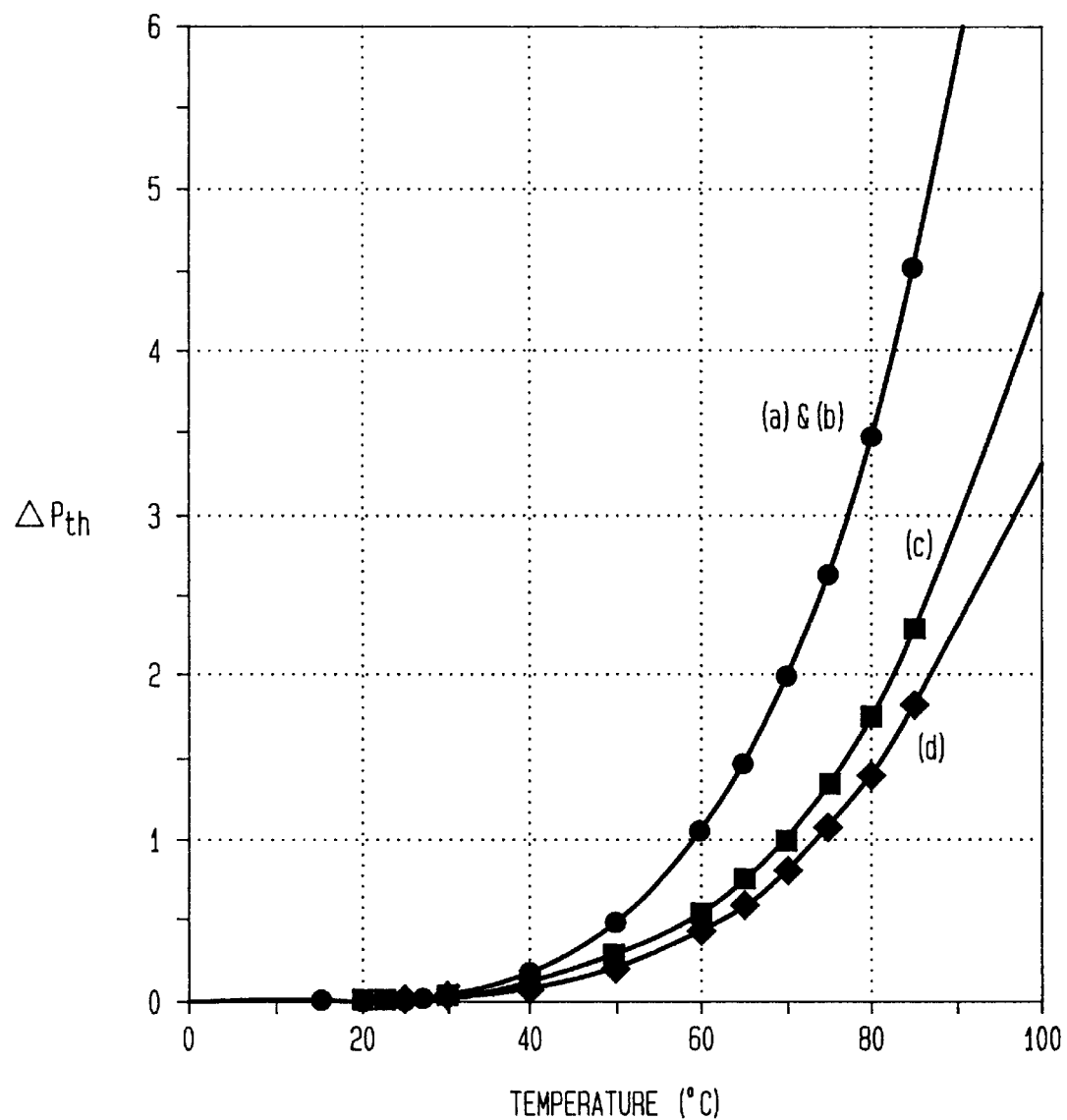
FIG. 4 is a graph comparing the temperature dependence of the normalized threshold power density $\Delta P_{th}$ of conventional SCH MQW lasers (Curves a and b) with SCH MQW lasers in accordance with one embodiment of our invention (Curves c and d).

The relative increase in the threshold power density versus temperature is shown in FIG. 4 for the four different laser structures. Samples (c) and (d) in accordance with our invention clearly demonstrate significantly smaller increases of the normalized threshold power $\Delta P_{th}$ with increasing temperature where $$\Delta P_{th}=[P_{th}(T)-P_{th}(15^\circ\text{ C.})]/P_{th}(15^\circ\text{ C.}) \tag{3}$$

Thus, FIG. 4 illustrates the importance of the Be delta-doped barrier layers for improving the temperature dependence of MQW laser structures.

Equally important, our data also showed that, depending on the Be concentration, the differential quantum efficiency $\eta_d$ was not adversely affected by the presence of the delta-doped region, nor was its temperature dependence. We also measured the relative change in slope efficiency as a function of temperature. This data more clearly showed that the efficiency had the same temperature dependence, independent of doping profile. It implies, therefore, that $\Delta\eta_i(T)$, $\Delta\eta_d(T)$ and $\Delta\alpha_i(T)$ are similar for both our inventive laser and conventional MQW lasers. In addition, we measured $\eta_i$ of about 82% for both of our inventive lasers, samples (c)and (d), as well as for conventional MQW lasers.

We also expect that doped barriers of this type will further reduce the power losses by decreasing $R_f$ and, consequently, also increase the modulation speed of the laser. The expected increase in speed is due to higher differential gain which is enhanced by suitable p-type doping in the doped barrier layers.

In addition, we expect that a further reduction in the peak carrier concentration of the doped barrier below $1.2\times10^{18}$ cm$^{-3}$, without changing its thickness, will also show better temperature sensitivity than prior art MQW lasers without substantially increasing the threshold current density and without significantly degrading the differential quantum efficiency.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

In particular, another embodiment of our invention embraces MQW lasers which include multiple doped barrier layers within each barrier region, each doped barrier layer being separated from one another and from adjacent quantum well layers by undoped barrier layers. As before, the thickness of the undoped barrier layers, especially those adjacent the quantum well layers, should be greater than a diffusion length of the dopant atoms in the barriers.

Another alternative embodiment of our invention relates to MQW laser designs where the active region structure begins (or ends) with a quantum well layer adjacent an inner cladding layer (e.g., the quantum well layers 12.1a and 12.1b adjacent inner cladding regions 22 and 20, respectively, in FIG. 2A). In those cases, thin, doped layers 22.1 and 20.1 may also be formed in the inner cladding regions 22 and 20, respectively. As with the barrier regions discussed above, these doped layers should be separated from their respective quantum wells by an undoped zone 22.2 and 20.2, respectively, of the inner cladding regions. T $_o$ this end, the thickness of the undoped zones should not be less than the dopant atom diffusion length in the cladding regions.

What is claimed is:

1. A SCH MQW laser comprising
    a semiconductor active region comprising a multiplicity of stacked repeat units, each unit including an InGaAsP quantum well layer and a wider bandgap InGaAsP barrier region adjacent one another, each of said quantum well layers being capable of generating stimulated emission of radiation when suitable pumping energy is applied thereto,
    an optical cavity resonator within which said active region is disposed,
    each of said barrier regions including a multiplicity of barrier layers, a multiplicity of said barrier regions each including a pair of undoped barrier layers and a p-type barrier layer positioned therebetween, said p-type barrier layer being a delta-doped layer with a dopant selected from the group consisting of Be, Mg and C to a hole sheet density of about $2\times10^{11}$ cm$^{-2}$–$1\times10^{12}$ cm$^{-2}$, the thickness of each of said undoped barrier layers being not less than a diffusion length of said selected dopant, and the thickness of said doped barrier layer being approximately one-fifth of the total thickness of said barrier region, so that said laser has a characteristic temperature of at least 77 K approximately,
    a pair of inner cladding semiconductor regions bounding said active region, and
    a pair of outer cladding semiconductor regions bounding said inner cladding regions.

2. The invention of claim 1 wherein said inner cladding regions each include an undoped cladding region adjacent a quantum well layer of said active region and a doped cladding region separated from said quantum layer by said undoped cladding region, the thickness of said undoped cladding region being not less than a diffuision length of the dopant in said doped cladding region.

* * * * *